United States Patent [19]

Ostwald

[11] Patent Number: 4,849,302
[45] Date of Patent: Jul. 18, 1989

[54] ELECTROLYTICALLY METALLIZED ARTICLE AND PROCESSES THEREFORE

[75] Inventor: Robert Ostwald, Ulm, Fed. Rep. of Germany

[73] Assignee: Licentia Patent-Verwaltungs-GmbH, Frankfurt, Fed. Rep. of Germany

[21] Appl. No.: 129,311

[22] Filed: Nov. 16, 1987

[30] Foreign Application Priority Data

May 24, 1985 [DE] Fed. Rep. of Germany ....... 3518766

[51] Int. Cl.[4] .......................... B32B 3/24; B32B 15/04; C25D 5/02
[52] U.S. Cl. ..................................... 428/621; 428/687; 428/935; 428/936; 204/15; 204/38.1
[58] Field of Search ................ 204/20, 22, 38.4, 35.1, 204/37.1, 15; 428/576, 687, 600, 935, 469, 457, 923, 926, 936; 29/163.5 R, 615, 621

[56] References Cited

U.S. PATENT DOCUMENTS

| | | | |
|---|---|---|---|
| 2,534,911 | 12/1950 | Kasper | 204/37.1 |
| 2,620,296 | 12/1952 | Wilsdon | 204/35.1 |
| 3,505,180 | 4/1970 | Boyden | 204/35.1 |
| 3,728,231 | 4/1973 | Gurev | 204/38.5 |
| 3,767,538 | 10/1973 | Polityuki et al. | 204/38.4 |
| 4,575,406 | 3/1986 | Slafer | 204/15 |
| 4,647,477 | 3/1987 | De Luca | 204/38.4 |
| 4,692,356 | 9/1987 | Ostwald et al. | 204/30 |

FOREIGN PATENT DOCUMENTS

| | | | |
|---|---|---|---|
| 7447 | 2/1980 | European Pat. Off. | 204/15 |
| 60640 | 4/1982 | Japan | 204/35.1 |
| 96895 | 6/1983 | Japan | 204/35.1 |
| WO84/1461 | 4/1984 | PCT Int'l Appl. | |
| 286632 | 7/1928 | United Kingdom | 204/35.1 |
| 233357 | 6/1959 | United Kingdom | 204/35.1 |

OTHER PUBLICATIONS

Altura et al., Plating, "Performance of Auoborate Cadmium Deposited Under Various Plating Conditions", 1974, pp. 850-853.
Nityamandan et al, Metal Finishing, "Hydrogen in Cadmium Plating", Oct. 1972, pp. 49–52.
Ahmad, S., Microwaves, "Selective Electroplating of Gold on Cu–Au Without Mask Lifting", Oct. 1981, pp. 71–72.
Photomethods for Industry, vol. 12, No. 10, Oct. 1969, "Two New Photo Resists", pp. 64, 66, 68.

Primary Examiner—John J. Zimmerman
Attorney, Agent, or Firm—Spencer & Frank

[57] ABSTRACT

An electrolytically metallized article and process therefore, the process including the steps of electrolytically depositing a metal layer onto a surface of the substrate; and structuring the metal layer to provide regularly distributed openings therein, which openings extend through to the substrate and have an interval between adjacent openings which permits, during any subsequent heat treatment of the metallized substrate, the escape of volatile and volatilizable substances included in the metal layer and the substrate during the electrolyte deposition. The interval between adjacent openings is preferably such that the structured metal layer has no continuous metal portion measured between adjacent openings which exceeds 2 mm.

27 Claims, 1 Drawing Sheet

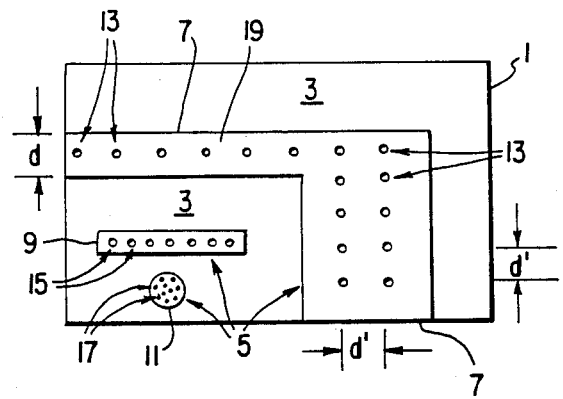

ELECTROLYTICALLY METALLIZED ARTICLE AND PROCESSES THEREFORE

This application is a continuation of application Ser. No. 863,873, filed May 15, 1986 now abandoned.

BACKGROUND OF THE INVENTION

1. Field of the Invention

The present invention relates to a process for metallizing a substrate, and more particularly to an electrolytic process for metallization of a substrate and an electrolytically metallized article manufactured thereby.

2. Background of the Art

For various uses, substrate materials of a metallic or nonmetallic nature are provided with metal coatings to improve their physical and/or chemical characteristics. A particularly economical metal coating process suitable for this purpose is electrolytic deposition. This can generally be accomplished directly on metal substrates after cleaning same and on nonmetal substrates, i.e. on substrates which are poor conductors or are non-conductors of electricity, after a premetallization thereof by physical or chemical techniques, for example, by vacuum deposition or electroless deposition, respectively.

During further processing or during practical use, these electrolytically produced metal layers must be able to withstand a series of different stresses. For example, thermal stresses must not unduly change the adhesion characteristics of the metal layer to the substrate. Adhesion of a metal layer is often undermined by critical loads from various sources of stresses, such as the mechanical stresses between the metal layer and the substrate which accompany a temperature change and are due to differing coefficients of thermal expansion and/or to chemical changes between the metal layer and the substrate material.

Electrolytic deposition in particular is known to be accompanied by inclusion of unwanted volatile or volatilizable substances, such as hydrogen, water, electrolyte residues, and organic plating bath additives, etc., in the metal layer and/or at the interface between the metal layer and the substrate, particularly if the substrates are porous. Thermal treatment of a metal layer with included impurities may generate localized high gas pressures due to fragmentation, evaporation and/or decomposition of the impurities. Such pressure may be reduced nondestructively by diffusion of the gases through the metal layer or may cause destructive separation of the metal layer from the substrate over a variably large surface area thereof. Generally, destructive separation of the metal layer manifests as a larger number of blisters which become larger and more numerous with decreasing adhesion.

The adhesion of metal layers deposited electrolytically on nonmetal substrates after premetallization thereof is usually not sufficient to prevent the formation of blisters under thermal stresses caused, for example, by soldering. Therefore, metal layers to be subjected to such thermal stresses have heretofore been produced on nonmetal substrates only by less economical processes requiring more costly apparatus, such as vacuum vapor deposition, cathode sputtering and chemical vapor deposition (CVD).

SUMMARY OF THE INVENTION

It is therefore an object of the present invention to provide an electrolytically metallized article and processes therefore of the type in which metal layers are deposited electrolytically on substrates, wherein the deposited metal layer has the highest possible adhesion, particularly under thermal stresses encountered during soft or hard soldering of components thereto as employed in the electrical industry.

This object is accomplished by a process for metallizing a substrate which includes the steps of electrolytically depositing a metal layer onto a surface of the substrate; and structuring the metal layer to provide regularly distributed openings therein, which openings extend through to the substrate and have an interval between adjacent openings which permits, during any subsequent heat treatment of the metallized substrate, the escape of volatile and volatilizable substances included in the metal layer and the substrate during the electrolytic deposition. Preferably the interval between adjacent openings is such that the structured metal layer has no continuous metal portion measured between adjacent openings which exceeds 2 mm. The regularly distributed openings may form a grid pattern of holes. The openings may be bores having a diameter which does not exceed 1 millimeter or microholes having a diameter which does not exceed 100 microns. The substrate may be a metal or a nonmetal, such as a ceramic material or a silicate material.

In a first preferred embodiment of the process for metallizing a substrate according to the invention, the process includes the steps of photolithographically generating a patterned photoresist layer on a surface of the substrate to be metallized, which patterned photoresist layer includes regularly distributed shapes and is discontinuous whereby portions of the surface are exposed, and which shapes have a predetermined interval between adjacent shapes; electrolytically depositing a metal layer onto the surface through the patterned photoresist layer; and removing the patterned photoresist layer, whereby a structured metal layer is obtained which is discontinuous and has regularly distributed openings provided therethrough, which openings have a cross-section corresponding to that of the shapes, and which openings have an interval between adjacent openings which permits, during any subsequent heat treatment of the metallized substrate, the escape of volatile and volatilizable substances included in the metal layer and the substrate during the electrolytic deposition.

In a second preferred embodiment of the process for metallizing a substrate according to the present invention, the process includes the steps of electrolytically depositing a metal layer onto a surface of the substrate; photolithographically generating a patterned photoresist layer on the metal layer, which patterned photoresist layer includes regularly distributed openings provided therethrough whereby portions of a predetermined metal layer are exposed, and which openings have a predetermined interval between adjacent openings; removing the exposed portions of the metal layer down to the substrate by chemically etching same; and removing the patterned photoresist layer, whereby a structured metal layer is obtained which is discontinuous and has regularly distributed openings provided therethrough, which openings have an interval between adjacent openings which permits, during any subsequent heat treatment of the metallized substrate, the escape of volatile and volatilizable substances included in the metal layer and the substrate during the electrolytic deposition.

In a third preferred embodiment of the process for metallizing a substrate according to the invention, the process includes the steps of electrolytically depositing a metal layer onto a surface of the substrate; and removing portions of the metal layer by a physical process down to the substrate in a predetermined pattern, which pattern includes regularly distributed openings, and which physical process is one of laser evaporating, drilling, puncturing and cutting, whereby a structured metal layer is obtained which is discontinuous and has regularly distributed openings provided therethrough.

Any of the foregoing processes thus provide an electrolytically metallized article which includes a substrate having a surface to be metallized electrolytically; an electrolytically deposited, structured metal layer provided on the substrate and having regularly distributed openings provided therein, which openings extend through to the substrate and have an interval between adjacent openings which permits, during any subsequent heat treatment of the metallized substrate, the escape of volatile and volatilizable substances included in the metal layer and the substrate during the electrolytic deposition. The interval between adjacent openings is preferably such that the structured metal layer has no continuous metal portion measured between adjacent openings which exceeds 2 mm. The regularly distributed openings may form a grid pattern of holes. The openings may be bores having a diameter which does not exceed 1 millimeter, or microholes having a diameter which does not exceed 100 microns.

BRIEF DESCRIPTION OF THE DRAWING

The invention may be better understood by referring to the details description of the invention when taken in conjunction with the accompanying drawing which shows, in top plan view, an electrolytically metallized article according to the invention.

DESCRIPTION OF THE PREFERRED EMBODIMENTS

The present invention is based on the realization that it is possible to economically structure or pattern the metal layer of a metallized substrate in such a way that, during a subsequent heat treatment, potentially-annoying volatile or volatilized substances nondestructively diffuse out of the layer or the interface between the structured metal layer and the substrate. According to the invention, the metal layer is geometrically structured to provide, for example, a pattern of regularly distributed, photolithographically-generated perforations therethrough. The structured metal layers according to the invention accommodate subsequent thermal stresses without destructive blistering, for example, those thermal stresses encountered during soft soldering at a temperature of about 280° C. for about 20 seconds or hard soldering at a temperature of about 400° C. for about 10 seconds. Thus, quite unexpectedly, by providing a metal layer with a grid pattern of perforations, such as micropores, a significantly improved adhesion thereof to a substrate has been achieved.

With reference to the drawing, shown in top plan view is a substrate 1 having a surface 3 which has been metallized electrolytically. The electrolytically deposited metal layer shown, simply by way of example, generally by 5 is structured in two ways. Patterns 7, 9 and 11 are generated therein by completely removing unwanted portions of the metal layer 5. Patterns 13, 15 and 17 of regularly distributed openings are also generated therein, down to the surface 3 of the substrate 1. Openings 13 and 15 are holes or bores having a diameter of less than 1 mm. Openings 17 are micropores having a diameter less than 100 microns.

Leg 19 of pattern 7 has a width d which is 2 mm and requires no openings as will be discussed with reference to the Examples in the following. Preferably, however, as shown in patterns 7, 9 and 11, even when the width or diameter, respectively, of the patterns is 2 mm or less, preferably a pattern of regularly distributed openings, 15 and 17, respectively, is provided. The interval d' between adjacent openings is preferably at most 2 mm, so that the structured metal layer has no continuous metal portion measured between adjacent openings which exceeds 2 mm. Thus, during any subsequent heat treatment, volatile or volatilizable substances included in the metal layer and the substrate, such as at the interface therebetween during electrolytic deposition are permitted to escape and blistering, i.e., delamination, of the metal layer substantially prevented thereby.

The invention will now be described in greater detail with reference to the following examples:

EXAMPLE 1

Ceramic substrates containing 99.5% $Al_2O_3$ and having the dimensions $50.8 \times 50.8 \times 0.6$ $mm^3$ were immersed, according to the well-known method, in molten NaOH to remove their glass-like "burn skin" and were rinsed thoroughly with demineralized water in an ultrasonic bath. The substrates were successively treated in a solution of tin(II) chloride and hydrochloric acid, in water, and in a solution of palladium chloride and hydrochloric acid, and rinsed in water to produce, according to the well-known method, a germination layer on the treated surfaces thereof which acts as a catalyst for the subsequent currentless chemical precipitation of metals thereon, i.e., for the electroless deposition of metals thereon. A copper base layer having a thickness of approximately $0.2\mu$ is precipitated onto this germination layer from a commercially available chemical copper bath. The copper base layer is subsequently reinforced, i.e., built up, by electroplating additional copper metal thereon from a commercially available copper sulfate bath, to form a glossy copper layer having a thickness of about $15\mu$.

Conventional photolithographic techniques were used to produce a photoresist layer on the copper layer, the photoresist layer having a dot pattern developed therethrough suitable for chemical etching of the exposed portions of the copper layer. That is, the copper layer was cleaned and dried, and a layer of photoresist was coated thereon and dried. The resist was exposed to actinic light image-wise through a mask having a dot pattern of $50\mu$ diameter dots spaced at 1 mm intervals from one another. The latent image produced was developed by immersion in a solvent which removed the photoresist from the area of the dots. Conventional photoetching techniques were used to spray etch the exposed copper to form bores or micropores of $50\mu$ diameter therein over a rectangular test surface of $20 \times 30$ $mm^2$. The micropores extended through the copper, down to the substrate, had a circular cross-section, and were arranged, as in the mask, in a dot pattern spaced at 1 mm intervals. The photoresist layer was then stripped away to produce metallized ceramic samples.

The adhesion of the metal layers to the ceramic substrate was tested as follows. The ceramic samples were heat treated at a temperature of 430° C., for 10 minutes, and in a nitrogen atmosphere. After cooling to room temperature (20° C.), an examination of the copper coatings revealed no blistering in the test areas of 20×30 mm² in which, according to the present invention, the metal layers were structured, i.e., patterned, with micropores, whereas, several large blisters were observed in the remaining areas having the conventionally continuous metal layers. After producing 1 mm wide test strips by photoetching, the strips were subjected to peel strength measurement using a tensile strength testing machine, Type 7 700 from the German firm Zwick GmbH & Co. The structured copper layer according to the invention required a high peeling force of about 0.5 N/mm to be separated from the ceramic surface. In the remaining, conventionally continuous region of the copper layer, blister formation caused those portions of the metal layer to peel with virtually no applied force. The noted blistering is believed to be due to the formation of localized high gas pressure areas of volatilized substances, which are trapped and have no pathway allowing diffusion, and which reach a level of pressure sufficient to cause destructive delamination.

EXAMPLE 2

As in Example 1, ceramic substrates containing 99.5% $Al_2O_3$ were immersed and treated to produce germination layers of catalytically effective nuclei thereon. Next, according to this example, a nickel phosphorus base layer having a thickness of about $0.1\mu$ is precipitated in an electroless precipitation onto the germination layer from a commercially available, chemical nickel hypophosphite bath. The nickel phosphorous layer was thoroughly rinsed and dried.

Conventional photolithographic techniques were used to produce a grid pattern of discrete photoresist dots spaced apart from one another by 2 mm intervals and having a diameter of about $100\mu$ on the nickel phosphorus base layer over a rectangular test surface of 20×30 mm². The majority of the surface of the nickel phosphorous base layer was thus exposed. Then, the base layer was electrolytically, added to in a commercially available copper sulfate bath, to form a copper layer having a thickness of about $10\mu$. After stripping away the photoresist dots, the metallized ceramic samples were thoroughly rinsed and dried.

The adhesion of the metal layers to the ceramic substrates was tested as follows. The ceramic substrates were heat treated at a temperature of 430° C., for 10 minutes, and in a nitrogen atmosphere, as in Example 1. After cooling to room temperature (20° C.), examination of the metal layers revealed no blistering in the test areas of 20×30 mm² in which, according to the present invention, the metal layers were structured, i.e., patterned, with a grid of holes or micropores, each micropore having a diameter of at most $100\mu$, whereas several small blisters were observed in the remaining areas having the conventionally continuous metal layers. Peel strength measurements were performed as in Example 1. The structured, i.e. perforated, metal layer regions according to the invention demonstrated very good adhesion, requiring a very high peeling force of about 0.7 N/mm to be separated from the ceramic surface.

The invention is not limited to the described examples, however, but can be applied similarly to other substrates, metallic and non-metallic, to other metal base layers and/or other electrolytically reinforcing metals, and to a structured metal layer which has a pattern other than or in addition to a grid of micropores therein. For example, as long as metal layers which are electrical conductor strips or paths having a width of 2 mm or less are desired, volatiles trapped during heat treatment have a pathway for diffusion and a further structuring of the metal layer is not absolutely necessary, although preferable. The 2 mm width is thus considered to be a critical dimension, at least for metal layers having a thickness within the order of magnitude according to the Examples. The production of such metal structures, i.e., electrical conductor strips, can be accomplished by the well known additive or semi-additive processes. In such metal structures, volatiles generated during the above-mentioned heat treatments diffuse and escape without damaging the layers.

Instead of photolithographic techniques, it is additionally possible to produce the above-mentioned structured metal layers by physical methods, such as by cutting, puncturing and drilling using a mechanical tool or by laser evaporation.

It will be understood that the above description of the present invention is susceptible to various modifications, changes and adaptations, and the same are intended to be comprehended within the meaning and range of equivalents of the appended claims.

What is claimed is:

1. A metallized article, comprising:
a ceramic substrate having a surface to be metallized
a structured metal layer comprised of a metal base layer deposited on the ceramic substrate by electroless deposition and a metal layer deposited on the metal base layer by electrolytic deposition, the structured metal layer having regularly distributed openings provided therein, which openings extend through to the substrate and have an interval between adjacent openings which permits, during any subsequent heat treatment of the metallized substrate, the escape of volatile and volatilizable substances included in the structured metal layer and the substrate.

2. The metallized article according to claim 1 wherein the interval between adjacent openings is such that the structured metal layer has no continuous metal portion measured between adjacent openings which exceeds 2 mm.

3. The metallized article according to claim 1, wherein the regularly distributed openings form a grid pattern of holes.

4. The metallized article according to claim 1, wherein the openings are bores having a diameter which does not exceed one millimeter.

5. The metallized article according to claim 1, wherein the openings are microholes having a diameter which does not exceed 100 microns.

6. The metallized article according to claim 1, wherein the metal base layer has a thickness ranging up to $0.2\mu$ and wherein the metal layer is comprised of copper and has a thickness ranging up to $15\mu$.

7. A process for metallizing a ceramic substrate, comprising:
premetallizing the ceramic substrate by electroless deposition thereon of a metal base layer;
electrolytically depositing a metal layer onto the metal base layer to form a reinforced metal layer composed of the metal base layer and the metal layer; and
structuring the reinforced metal layer to provide a structured metal layer having regularly distributed openings therein, which openings extend through to the ceramic substrate and have an interval between adjacent openings which permits, during any subsequent heat treatment of the metallized ceramic substrate, the escape of volatile and volatilizable substances included in the structured metal layer and the substrate.

8. The process according to claim 1, wherein the interval between adjacent openings is such that the structured metal layer has no continuous metal portion measured between adjacent openings which exceeds 2 mm.

9. The process according to claim 1, wherein the regularly distributed openings form a grid pattern of holes.

10. The process according to claim 1, wherein the openings are bores having a diameter which does not exceed 1 millimeter.

11. The process according to claim 1, wherein the openings are microholes having a diameter which does not exceed 100 microns.

12. The process according to claim 1, wherein the metal base layer has a thickness ranging up to $0.2\mu$ and wherein the metal layer is comprised of copper and has a thickness ranging up to $15\mu$.

13. A process for metallizing a ceramic substrate, comprising:
   depositing a metal layer onto a surface of the substrate by electroless deposition; and
   structuring the metal layer to provide a structured metal layer having regularly distributed openings therein, which openings extend through to the substrate and have an interval between adjacent openings which permits, during any subsequent heat treatment of the metallized substrate, the escape of volatile and volatilizable substances included in the structured metal layer and the substrate.

14. The process according to claim 13, wherein the interval between adjacent openings is such that the structured metal layer has no continuous metal portion measured between adjacent openings which exceeds 2 mm.

15. The process according to claim 13, wherein the metal layer is comprised of copper and has a thickness ranging up to $15\mu$.

16. A metallized article, comprising:
   a ceramic substrate having a surface to be metallized; and
   a structured metal layer comprised of a metal base layer deposited on the ceramic substrate by electroless deposition and a metal layer deposited on the metal base layer by electroless deposition, the structured metal layer having regularly distributed openings provided therein, which openings extend through to the substrate and have an interval between adjacent openings which permits, during any subsequent heat treatment of the metallized substrate, the escape of volatile and volatilizable substances included in the structured metal layer and the substrate.

17. The metallized article according to claim 16, wherein the interval between adjacent openings is such that the structured metal layer has no continuous metal portion measured between adjacent openings which exceeds 2 mm.

18. The article according to claim 16, wherein the metal base layer has a thickness ranging up to $0.2\mu$ and wherein the metal layer is comprised of copper and has a thickness ranging up to $15\mu$.

19. A process for metallizing a ceramic substrate, comprising:
   photolithographically generating a patterned photoresist layer on a surface of the ceramic substrate to be metallized, which patterned photoresist layer includes regularly distributed shapes whereby portions of the surface are exposed, and which regularly distributed shapes have a predetermined interval between adjacent shapes;
   premetallizing the portions of the surface of the ceramic substrate which are exposed by electroless deposition thereon of a metal base layer;
   electrolytically depositing a metal layer onto the metal base layer through the patterned photoresist layer to form a structured metal layer composed of the metal base layer and the metal layer; and
   removing the patterned photoresist layer, whereby the structured metal layer remains and has regularly distributed openings provided therethrough, which openings have an interval between adjacent openings which permits, during any subsequent heat treatment of the metallized substrate, the escape of volatile and volatilizable substances included in the structured metal layer and the substrate.

20. The process according to claim 19, wherein the interval between adjacent openings is such that the structured metal layer has no continuous metal portion measured between adjacent openings which exceeds 2 mm.

21. The process according to claim 7, wherein the metal base layer has a thickness ranging up to $0.2\mu$ and wherein the metal layer is comprised of copper and has a thickness ranging up to $15\mu$.

22. A process for metallizing a ceramic substrate, comprising:
   premetallizing the ceramic substrate by electroless deposition thereon of a metal base layer;
   electrolytically depositing a metal layer onto the metal base layer to form a reinforced metal layer composed of the metal base layer and the metal layer;
   photolithographically generating a patterned photoresist layer on the reinforced metal layer, which patterned photoresist layer includes regularly distributed openings provided therethrough whereby portions of the reinforced metal layer are exposed, and which openings have a predetermined interval between adjacent openings;
   removing the exposed portions of the reinforced metal layer down to the substrate by chemically etching same; and
   removing the patterned photoresist layer, whereby a structured metal layer is obtained which has regularly distributed openings provided therethrough, which openings have an interval between adjacent openings which permits, during any subsequent heat treatment of the metallized substrate, the escape of volatile and volatilizable substances included in the structured metal layer and the substrate.

23. The process according to claim 22, wherein the interval between adjacent openings is such that the structured metal layer has no continuous metal portion measured between adjacent openings which exceeds 2 mm.

24. The process according to claim 9, wherein the metal base layer has a thickness ranging up to $0.2\mu$ and wherein the metal layer is comprised of copper and has a thickness ranging up to $15\mu$.

25. A process for metallizing a ceramic substrate, comprising:
   premetallizing the ceramic substrate by electroless deposition thereon of a metal base layer;
   electrolytically depositing a metal layer onto the metal base layer to form a reinforced metal layer composed of the metal base layer and the metal layer; and
   removing portions of the reinforced metal layer by a physical process down to the substrate in a predetermined pattern, which pattern includes regularly distributed openings, and which physical process is one of laser evaporating, drilling, puncturing and cutting, whereby a structured metal layer is obtained which has regularly distributed openings provided therethrough, and which openings have an interval between adjacent openings which permits, during any subsequent heat treatment of the metallized substrate, the escape of volatile and volatilizable substances included in the structured metal layer and the substrate.

26. The process according to claim 1, wherein the interval between adjacent openings is such that the structured metal layer has no continuous metal portion measured between adjacent openings which exceeds 2 mm.

27. The process according to claim 25, wherein the metal base layer has a thickness ranging up to $0.2\mu$ and wherein the metal layer is comprised of copper and has a thickness ranging up to $15\mu$.

* * * * *

UNITED STATES PATENT AND TRADEMARK OFFICE
CERTIFICATE OF CORRECTION

PATENT NO. : 4,849,302

DATED : Jul. 18, 1989

INVENTOR(S) : Robert Ostwald

It is certified that error appears in the above-identified patent and that said Letters Patent is hereby corrected as shown below:

On the title page:
  Please insert into the caption --[63] Continuation of Serial No. 06/863,873, May 15, 1986, abandoned.--

Signed and Sealed this

Twenty-ninth Day of May, 1990

Attest:

HARRY F. MANBECK, JR.

*Attesting Officer*     *Commissioner of Patents and Trademarks*